United States Patent
Ridley et al.

(10) Patent No.: US 9,812,407 B2
(45) Date of Patent: Nov. 7, 2017

(54) SELF-DESTRUCTING ELECTRONIC DEVICE

(71) Applicant: Honeywell International Inc., Morristown, NJ (US)

(72) Inventors: Jeff A Ridley, Shorewood, MN (US); Steven Tin, Plymouth, MN (US); Jeffrey James Kriz, Eden Prairie, MN (US)

(73) Assignee: Honeywell International Inc., Morris Plains, NJ (US)

( * ) Notice: Subject to any disclaimer, the term of this patent is extended or adjusted under 35 U.S.C. 154(b) by 112 days.

(21) Appl. No.: 14/869,367

(22) Filed: Sep. 29, 2015

(65) Prior Publication Data

US 2017/0092598 A1   Mar. 30, 2017

(51) Int. Cl.
*H01L 23/00* (2006.01)

(52) U.S. Cl.
CPC .................................. *H01L 23/573* (2013.01)

(58) Field of Classification Search
CPC ...... H01L 23/57; H01L 23/573; H01L 23/576
See application file for complete search history.

(56) References Cited

U.S. PATENT DOCUMENTS

| | | | |
|---|---|---|---|
| 3,725,671 A | 4/1973 | Keister et al. | |
| 3,882,323 A | 5/1975 | Smolker | |
| 5,736,777 A | 4/1998 | Shield et al. | |
| 7,836,516 B2 | 11/2010 | Stidl et al. | |
| 8,288,857 B2 | 10/2012 | Das et al. | |
| 8,812,875 B1 | 8/2014 | Melvin | |
| 2014/0103485 A1 | 4/2014 | Fritz et al. | |

FOREIGN PATENT DOCUMENTS

| CN | 103514383 | 1/2014 |
|---|---|---|
| DE | 19957119 | 5/2001 |

OTHER PUBLICATIONS

Williams, "Xerox Parc's New Chip Will Self Destruct in 10 Seconds", "http://www.pcworld.com/article/2983015/hardware/xerox-parcs-new-chip-will-self-destruct-in-10-seconds.html", IDG News Service, Sep. 10, 2015, pp. 14, Published in: US.

*Primary Examiner* — Robert Carpenter
(74) *Attorney, Agent, or Firm* — Fogg & Powers LLC

(57) ABSTRACT

A self destructing device includes: at least one active electronic region and at least one thermal destruction trigger; at least one chamber enclosed by the semiconducting material, wherein the at least one chamber contains an etchant material, wherein in response to activation of the at least one thermal destruction trigger, the self-destructing device is configured to: generate heat to cause decomposition of at least a first portion of the etchant material; decompose at least a first portion of the etchant material; etch at least a second portion of the second oxide layer provided between the semiconducting material and the at least one chamber at a first temperature; expose the etchant material to the semiconducting material to cause an exothermic reaction generating more heat; enable spread of the exothermic reaction to etch at least a third portion of the first oxide layer and to etch the top layer.

13 Claims, 5 Drawing Sheets

SELF-DESTRUCTING ELECTRONIC DEVICE

STATEMENT REGARDING FEDERALLY SPONSORED RESEARCH OR DEVELOPMENT

This invention was made with Government support under Government Contract Number FA8650-14-C-7402 awarded by USAF/AFMC. The Government has certain rights in the invention.

BACKGROUND

Electronic circuits may contain sensitive information with military and national security implications. Such chips benefit from the ability to self-destruct in order to prevent the sensitive information from disseminating.

SUMMARY

A self-destructing device includes: a top layer including at least one active electronic region and at least one thermal destruction trigger; a middle layer including semiconducting material and at least one chamber, wherein the at least one chamber is enclosed by the semiconducting material, wherein the at least one chamber contains an etchant material configured to react in an exothermic manner with the semiconducting material to generate heat; a first oxide layer provided between the top layer and the middle layer; a second oxide layer provided between the semiconducting material and the at least one chamber. In response to activation of the at least one thermal destruction trigger, the self-destructing device is configured to: generate heat to cause decomposition of at least a first portion of the etchant material; decompose at least a first portion of the etchant material to cause etching of the second oxide layer; etch at least a second portion of the second oxide layer provided between the semiconducting material and the at least one chamber at a first temperature to cause exposure of the etchant material to the semiconducting material; expose the etchant material to the semiconducting material to cause an exothermic reaction generating more heat; enable spread of the exothermic reaction to etch at least a third portion of the first oxide layer; and etch the top layer through at least one void created in the first oxide layer.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
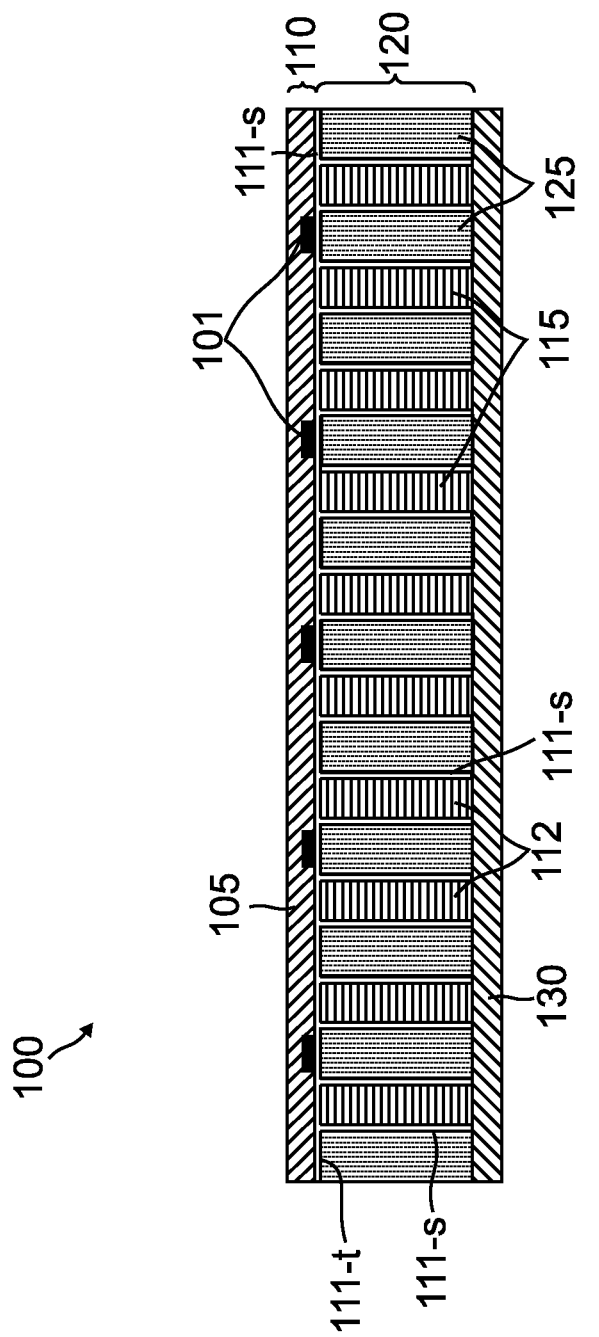
FIG. 1 is a cross section diagram of an exemplary self-destructing device having at least one chamber filled with etchant material.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

In some systems, energetic material is often embedded in the device in macro size packets and the chip is destroyed once exploded. However, large pieces of the device are often left behind post explosion and the information on the chip can be obtained through the process of reverse engineering. Further, since the energetic material is often not integrated into the device at a micro-scaled level, the energetic material could be removed and critical information on the chip is left unprotected. For reasons state above and for other reasons stated below, it will become apparent to those skilled in the art upon reading and understanding the specification, there is a need in the art for improved systems and methods for a self-destructing chip that is well protected and leaves little debris after destruction.

Embodiments described herein provide for a self-destructing device that includes an etchant material within a structural component of the self-destructing device that reacts in an exothermic manner. The etchant material begins the destruction process when thermally triggered and is designed to etch away the active electronic regions where information is stored. Further, the self-destructing device is designed to thermally sustain itself until the active electronic regions are etched away.

FIG. 1 describes one embodiment of an exemplary self-destructing device 100 that is capable of disintegrating in a controlled, triggerable manner. As described in some embodiments herein, self-destructing device 100 is designed to disintegrate through an etching process that is thermally triggered. In some embodiments, self-destructing device 100 is a self-destructing chip. Self-destructing device 100 is fabricated with at least two layers: a top layer 110 including at least one active electronic region 105 where information is stored and at least one thermal destruction trigger 101, and a middle layer 120 including a semiconducting material 125 and etchant material 115.

The middle layer 120 is primarily a substrate including a semiconducting material 125 providing mechanical support for the top layer 110. In the embodiment shown in FIG. 1, the middle layer 120 further includes at least one chamber 112 in the substrate containing an etchant material 115 that reacts in an exothermic manner. In exemplary embodiments, etchant material 115 includes a mixture of two or more materials. In exemplary embodiments, etchant material 115 includes at least one of sodium bifluoride ($NaHF_2$) and xenon difluoride ($XeF_2$). Each of the at least one chamber 112 is enclosed by the semiconducting material 125. In one embodiment, the semiconducting material 125 enclosing the at least one chamber 112 is silicon.

In exemplary embodiments, the top layer 110 is fabricated on a front side of the middle layer 120 and further includes metal layers, interconnecting wires and dielectric portions isolating the various interconnecting wires along with the active electronic regions 105. The top layer 110 also includes at least one thermal destruction trigger 101 that generates heat when activated. In one embodiment, the thickness of top layer 110 is 6 microns. In other embodiments, the thickness can vary depending on the features included within the top layer 110.

In some examples, the at least one thermal destruction trigger 101 is positioned in the top layer 110 in a pattern most effective to initiate exothermic reaction of the etchant material 115. For example, in the embodiment shown in FIG. 1, the at least one thermal destruction trigger 101 includes a plurality of thermal destruction triggers included in top layer 110 such that each of the at least one thermal destruction trigger 101 is adjacent to at least a first respective chamber of the at least one chamber 112. In exemplary embodiments, the at least one thermal destruction trigger 101 includes a plurality of thermal destruction triggers positioned adjacent to each of the at least one chamber 112. In some other examples, the at least one thermal destruction trigger 101 includes a plurality of thermal destruction triggers placed in top layer 110 such that each of the at least one chamber 112 is adjacent to a respective thermal destruction trigger 101. In yet other examples, the at least one thermal destruction trigger 101 includes a plurality of thermal destruction triggers concentrated toward a single area of the self-destructing device 100.

In exemplary embodiments, thermal destruction triggers 101 are configured to be activated when current is applied. In exemplary embodiments, thermal destruction triggers 101 are coupled to an internal or an external voltage source. In exemplary embodiments, self-destructing device 100 is configured to autonomously activate the at least one thermal destruction trigger 101 at the end of useful lifetime of the power source of the self-destructing device 100. In another embodiment, the self-destructing device 100 is configured to receive a command to self-destruct and at least one thermal destruction trigger 101 is activated. In exemplary embodiments, power for activating the at least one thermal destruction trigger 101 is provided by an internal power source included within the self-destructing device 100. In other examples, power is provided from an external power source.

Self-destructing device 100 further includes a first oxide layer 111-*t* provided between the top layer 110 and the middle layer 120 and a second oxide layer 111-*s* provided between the semiconducting material 125 and the at least one chamber 112. The first oxide layer 111-*t* and the second oxide layer 111-*s* includes material that is etched to allow interaction between semiconducting material 125 and etchant material 115. In some embodiments, the first oxide layer 111-*t* is composed of the same material as the second oxide layer 111-*s*. In other embodiments, the first oxide layer 111-*t* and the second oxide layer 111-*s* are composed of different materials. In one embodiment, the oxide layer 111-*t* and the oxide layer 111-*s* include silicon oxide.

Figure 2A:
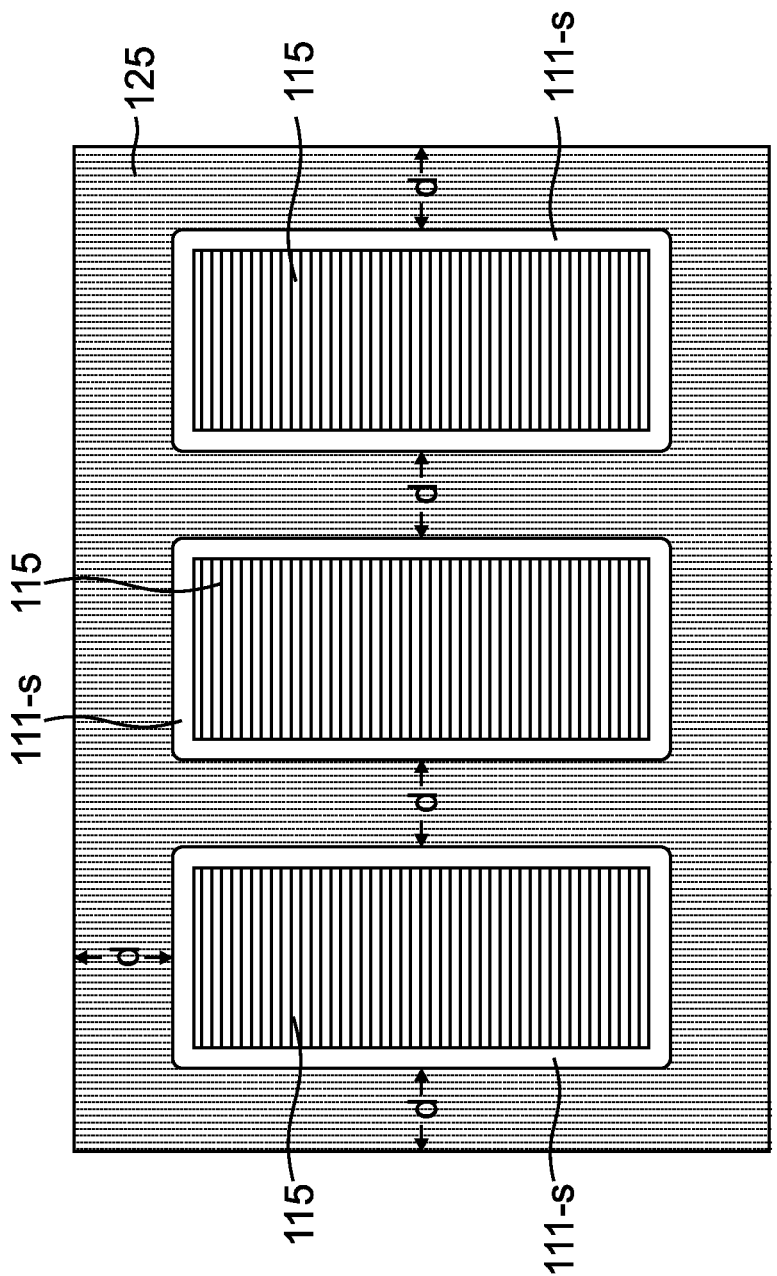
FIG. 2A-2C are top view diagrams of embodiments of a middle layer of an exemplary self-destructing device.
Figure 2B:
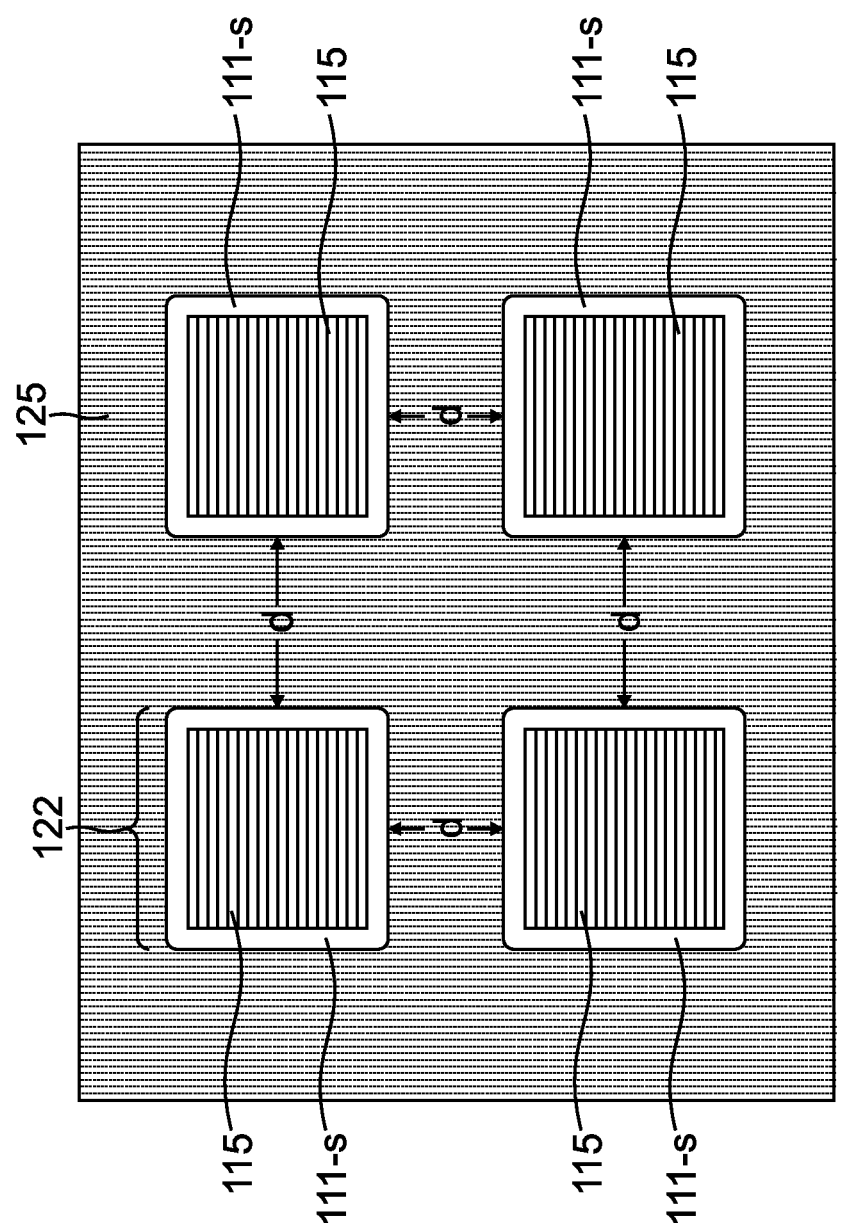
Figure 2C:
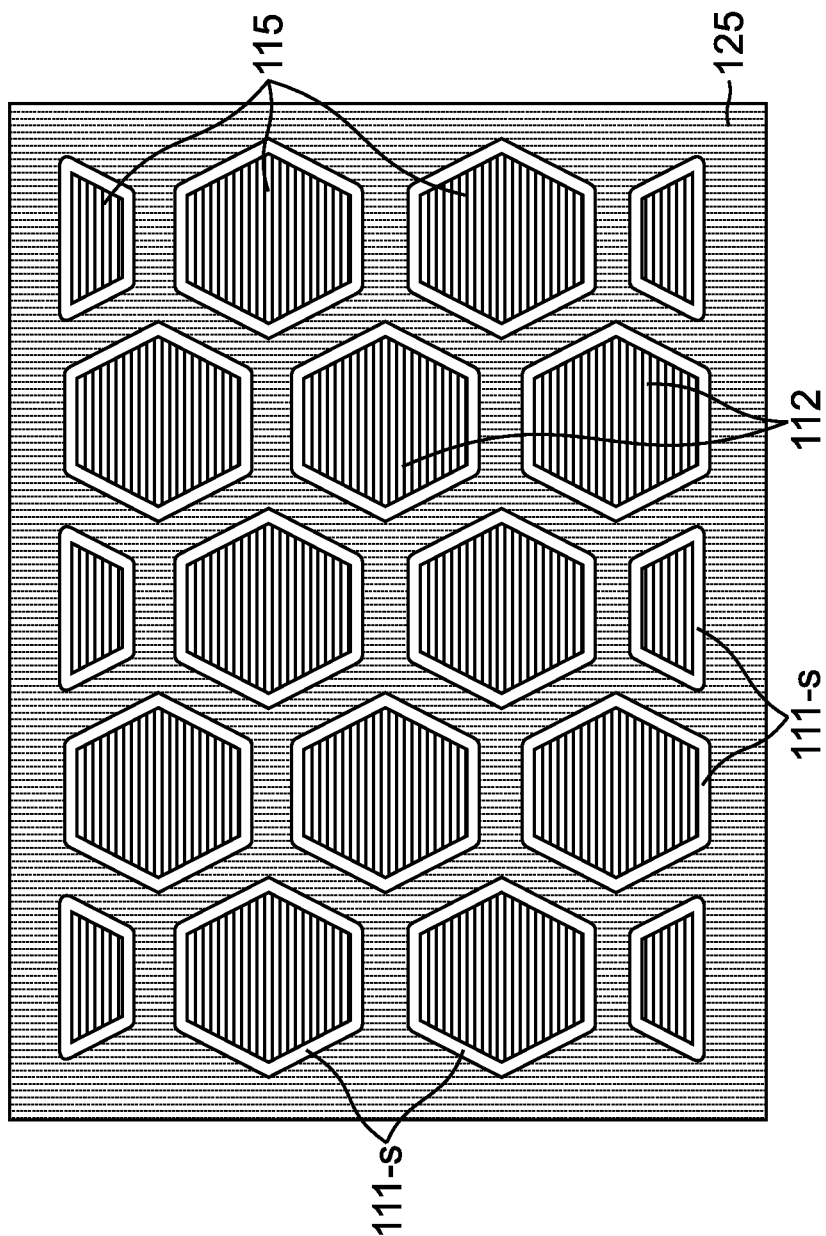

FIG. 2A-2C are top view of embodiments of middle layer 120 of self-destructing device 100. In the example shown in FIGS. 2A and 2B, each at least one chamber 112 is a rectangular pocket and aligns with at least one other chamber of the at least one chamber 112 of self-destructing device 100. In exemplary embodiments, the chambers are aligned at an equidistant distance d to one another. In the example shown in FIG. 2C, a plurality of chambers of the at least one chamber 112 are provided in a honeycomb formation. As shown in FIGS. 2A-2C, a plurality of chambers of the at least one chamber 112 are enclosed by semiconducting material 125 and the second oxide layer 111-*s* is disposed between the plurality of chambers of the at least one chambers 112 and semiconducting material 125 on all sides of the chambers. In exemplary embodiments, a first amount of etchant material 115 and a second amount of semiconducting material 125 in self-destructing device 100 is approximately equal.

When the at least one thermal destruction trigger 101 are activated, the triggers 101 provide enough heat to cause at least a portion of the etchant material 115 to start decomposing. The decomposition etches at least a portion of the second oxide layer 111-*s*, exposing the etchant material 115 to the semiconducting material 125. This allows at least a portion of the etchant material 115 to interact with the semiconducting material 125. In addition to destroying semiconducting material 125, the interaction between etchant material 115 and semiconducting material 125 results in an exothermic reaction generating more heat. The reaction spreads across self-destructing device 100 and decomposes more etchant material 115 to etch first oxide layer 111-*t*, second oxide layer 111-*s*. The exothermic reaction spreads through the voids created in the first oxide layer 111-*t* to further etch top layer 110 rendering the information contained in self-destructing device 100 unintelligible.

In exemplary embodiments, self-destructing device 100 includes a bottom cap seal 130 on a back side of middle layer 120. Bottom cap seal 130 covers at least one opening of the at least one chamber 112, and in some embodiments, provides a hermetic seal to prevent any unintended reactions that may result due to interaction of etchant material 115 with external substances. In exemplary embodiments, bottom cap seal 130 includes a material not reactive to etchant material 115. In exemplary embodiments, bottom cap seal 130 includes an oxygen and humidity blocking sheet. In an exemplary, bottom cap seal 130 includes silicon nitride. In an exemplary, bottom cap seal 130 includes an adhesive. In some embodiments, bottom cap seal 130 is also destructed when thermal destruction triggers 101 are activated.

In an exemplary, the substrate of semiconducting material 125 is composed of silicon, the first oxide layer 111-*t* and the second oxide layer 111-*s* is composed of silicon oxide ($SiO_2$), and etchant material 115 is a mixture of sodium bifluoride ($NaHF_2$) and xenon difluoride ($XeF_2$). In such an exemplary, when at least one thermal destruction trigger 101 is activated, $NaHF_2$ decomposes due to the heat generated by the at least one thermal destruction trigger 101 and releases hydrogen fluoride (HF) at a first temperature. In an exemplary, the first temperature is 160° C. The released HF breaks down second oxide layer 111-*s* and allows $XeF_2$ to interact with the silicon substrate. This interaction results in an exothermic reaction and generates more heat. More $NaHF_2$ decomposes and more HF is released to destroy silicon substrate 125. The reaction spreads through self-destructing device 100, etches the first oxide layer 111-*t* and eventually destroys the components of top layer 110 including active electronic regions 105 rendering information contained in self-destructing device 100 unintelligible.

Figure 3:
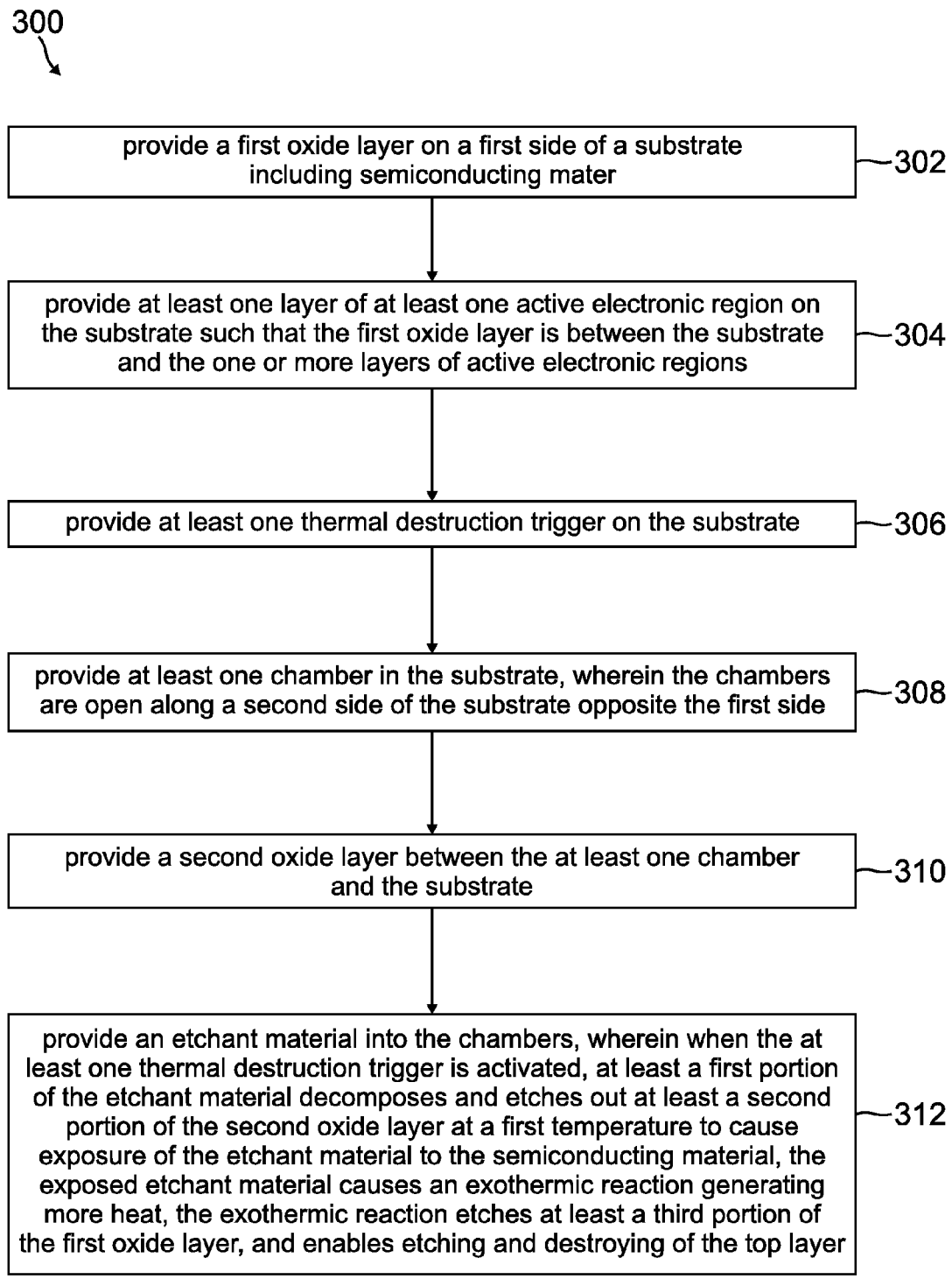
FIG. 3 is a flow diagram showing an exemplary method 300 of fabricating an exemplary self-destructing device, such as the exemplary self-destructing device of FIG. 1.

FIG. 3 is a flow diagram showing an exemplary method 300 of fabricating a self-destructing device. As discussed herein, the method 300 is described with respect to examples of the self-destructing device shown in FIGS. 1-2C. However, method 300 may apply to other examples of a self-destructive device as well.

Method 300 begins at block 302 with providing a first oxide layer on a first side of a substrate including a semiconducting material. In exemplary embodiments of this method, the semiconducting material includes silicon. In exemplary embodiments, providing the first oxide layer further comprises depositing a layer of oxide material using chemical vapor deposition. In a further example, the layer of oxide material is deposited using plasma enhanced chemical vapor deposition. In exemplary embodiments, the first oxide layer includes silicon oxide.

The method proceeds to block 304 with providing at least one layer of at least one active electronic region on the substrate such that the first oxide layer is between the substrate and the at least one layer of the at least one active electronic region. The method proceeds to block 306 with providing at least one thermal destruction trigger on the substrate.

The method then proceeds to block 308 with providing at least one chamber in the substrate, wherein the at least one chamber is open along a second side of the substrate opposite the first side. In exemplary embodiments, providing at least one chamber in the substrate further comprises providing at least one respective chamber adjacent to each thermal destruction trigger in self-destructing device. In an exemplary, method 300 further comprises sealing the openings of the at least one chamber with a bottom cap seal. In exemplary embodiments, bottom cap seal includes a material that is not reactive to an etchant material provided into the at least one chamber. In exemplary embodiments, bottom cap seal includes an oxygen and humidity blocking sheet. In exemplary embodiments, bottom cap seal includes silicon nitride.

At block 310, method 300 comprises providing a second oxide layer between the at least one chamber and substrate. In an exemplary, providing a second oxide layer further comprises depositing a layer of oxide material using chemical vapor deposition. In a further example, the layer of oxide material is deposited using plasma enhanced chemical vapor deposition. In an exemplary, the first oxide layer and second oxide layer include a layer of the same oxide material. In exemplary embodiments, second oxide layer includes silicon oxide.

The method proceeds to block 312 with providing an etchant material into the at least one chamber, wherein when the at least one thermal destruction trigger is activated, at least a first portion of the etchant material decomposes and etches out at least a second portion of the second oxide layer at a first temperature to cause exposure of the etchant material to the semiconducting material, the exposed etchant material causes an exothermic reaction generating more heat, the exothermic reaction etches at least a third portion of the first oxide layer and enables etching and destroying of the top layer. In an exemplary, providing an etchant material into the at least one chamber further comprises filling the at least one chamber with a first material configured to decompose when the at least one thermal destruction trigger is activated and etch the oxide material between the at least one chamber and substrate, and filling the at least one chamber with a second material configured to interact with the substrate to generate more heat. In a further example, the first material includes sodium bifluoride ($NaHF_2$) and the second material includes xenon difluoride ($XeF_2$).

Example Embodiments

Example 1 includes a self-destructing device comprising: a top layer including at least one active electronic region and at least one thermal destruction trigger; a middle layer including semiconducting material and at least one chamber, wherein the at least one chamber is enclosed by the semiconducting material, wherein the at least one chamber contains an etchant material configured to react in an exothermic manner with the semiconducting material to generate heat; a first oxide layer provided between the top layer and the middle layer; a second oxide layer provided between the semiconducting material and the at least one chamber; and wherein in response to activation of the at least one thermal destruction trigger, the self-destructing device is configured to: generate heat to cause decomposition of at least a first portion of the etchant material; decompose at least a first portion of the etchant material to cause etching of the second oxide layer; etch at least a second portion of the second oxide layer provided between the semiconducting material and the at least one chamber at a first temperature to cause exposure of the etchant material to the semiconducting material; expose the etchant material to the semiconducting material to cause an exothermic reaction generating more heat; enable spread of the exothermic reaction to etch at least a third portion of the first oxide layer; and etch the top layer through at least one void created in the first oxide layer.

Example 2 includes the self-destructing device of Example 1, wherein at least one of the first oxide layer and the second oxide layer is composed of silicon oxide.

Example 3 includes the self-destructing device of any of Examples 1-2, wherein the semiconducting material is silicon.

Example 4 includes the self-destructing device of any of Examples 1-3, wherein the etchant material includes at least one of sodium bifluoride and xenon difluoride.

Example 5 includes the self-destructing device of any of Examples 1-4 further comprising a bottom cap seal covering at least one opening of the at least one chamber.

Example 6 includes the self-destructing device of Example 5, wherein the bottom cap seal includes a material that is not reactive to the etchant material in the middle layer.

Example 7 includes the self-destructing device of any of Examples 5-6, wherein the bottom cap seal includes an oxygen and humidity blocking sheet.

Example 8 includes the self-destructing device of any of Examples 5-7, wherein the bottom cap seal is composed of a material that is configured to etch when the at least one thermal destruction trigger is activated.

Example 9 includes the self-destructing device of any of Examples 1-8, wherein the top layer has a thickness of six microns.

Example 10 includes the self-destructing device of any of Examples 1-9, wherein a first amount of etchant material in the at least one chamber is approximately equal to a second amount of semiconducting material.

Example 11 includes the self-destructing device of any of Examples 1-10, wherein the at least one thermal destruction trigger is adjacent to a respective chamber of the at least one chamber.

Example 12 includes the self-destructing device of any of Examples 1-11, wherein the self-destructing device is a self-destructing electronic chip.

Example 13 includes a method of fabricating a self-destructing device, the method comprising: providing a first oxide layer on a first side of a substrate including semiconducting material; providing at least one layer of at least one active electronic region on the substrate such that the first oxide layer is between the substrate and the at least one layer of at least one active electronic region; providing at least one thermal destruction trigger on the substrate; providing at least one chamber in the substrate, wherein the chambers are open along a second side of the substrate opposite the first side; providing a second layer of oxide material between the at least one chamber and the substrate; and providing an etchant material into the chambers; wherein when the at least one thermal destruction trigger is activated, at least a first portion of the etchant material decomposes and etches out at least a second portion of the second oxide layer at a first temperature to cause exposure of the etchant material to the semiconducting material, the exposed etchant material causes an exothermic reaction generating more heat, the exothermic reaction etches at least a third portion of the first oxide layer and enables etching and destroying of the top layer.

Example 14 includes the method of Example 13 further comprising sealing openings of the at least one chamber with a bottom cap seal.

Example 15 includes the method of any of Examples 13-14, wherein providing a layer of oxide layer further comprises depositing an oxide material using plasma enhanced chemical vapor deposition (PECVD).

Example 16 includes the method of any of Examples 13-15, wherein providing the etchant material into the chambers further comprises: filling the chambers with a first material configured to decompose when the at least one thermal destruction trigger is activated and etch the second oxide layer between the at least one chamber and the substrate; and filling the chambers with a second material configured to interact with the semiconducting material included in the substrate to generate more heat.

Example 17 includes the method of any of Examples 13-16, wherein the first material includes sodium bifluoride and the second material includes xenon difluoride, wherein the first oxide layer and the second oxide layer include silicon oxide, and wherein the semiconducting material includes silicon.

Example 18 includes the method of any of Examples 13-17, wherein sealing the openings of the at least one chamber is done with a bottom cap seal composed of an oxygen and humidity blocking material.

Example 19 includes the method of any of Examples 13-18, wherein providing at least one chamber in the substrate further comprises providing at least one chamber adjacent to each respective thermal destruction trigger of the self-destructing device.

Example 20 includes a self-destructing chip comprising: a silicon substrate enclosing at least one chamber containing a combination of sodium bifluoride and xenon difluoride; at least one active electronics layer provided over a first side of the silicon substrate, the at least one active electronics layer including at least one thermal destruction trigger, the at least one thermal destruction trigger coupled to a voltage source and configured to generate heat when powered; silicon oxide provided between the silicon substrate and the at least one active electronic layers and between the silicon substrate and the at least one chamber enclosed by the silicon substrate; and a silicon nitride interface covering at least one opening of the at least one chamber on a second side of the silicon substrate; wherein in response to activation of the at least one thermal destruction trigger, the self-destructing chip is configured to: decompose the sodium bifluoride and release hydrogen fluoride at a first temperature to etch the silicon oxide between the silicon substrate and the at least one chamber; expose xenon dilfluoride to the silicon substrate to destroy the silicon substrate and generate more heat resulting in an exothermic reaction; etch the silicon oxide between the silicon substrate and the at least one active electronics layer; and facilitate the spread of the exothermic reaction to etch the at least one active electronics layer.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A self-destructing device comprising:
   a top layer including at least one active electronic region and at least one thermal destruction trigger;
   a middle layer including semiconducting material and at least one chamber, wherein the at least one chamber is enclosed by the semiconducting material, wherein the at least one chamber contains an etchant material configured to react in an exothermic manner with the semiconducting material to generate heat;
   a first oxide layer provided between the top layer and the middle layer;
   a second oxide layer provided between the semiconducting material and the at least one chamber; and
   wherein in response to activation of the at least one thermal destruction trigger, the self-destructing device is configured to:
   generate heat to cause decomposition of at least a first portion of the etchant material;
   decompose at least a first portion of the etchant material to cause etching of the second oxide layer;
   etch at least a second portion of the second oxide layer provided between the semiconducting material and the at least one chamber at a first temperature to cause exposure of the etchant material to the semiconducting material;
   expose the etchant material to the semiconducting material to cause an exothermic reaction generating more heat;
   enable spread of the exothermic reaction to etch at least a third portion of the first oxide layer; and
   etch the top layer through at least one void created in the first oxide layer.

2. The self-destructing device of claim 1, wherein at least one of the first oxide layer and the second oxide layer is composed of silicon oxide.

3. The self-destructing device of claim 1, wherein the semiconducting material is silicon.

4. The self-destructing device of claim 1, wherein the etchant material includes at least one of sodium bifluoride and xenon difluoride.

5. The self-destructing device of claim 1 further comprising a bottom cap seal covering at least one opening of the at least one chamber.

6. The self-destructing device of claim 5, wherein the bottom cap seal includes a material that is not reactive to the etchant material in the middle layer.

7. The self-destructing device of claim 5, wherein the bottom cap seal includes an oxygen and humidity blocking sheet.

8. The self-destructing device of claim 5, wherein the bottom cap seal is composed of a material that is configured to etch when the at least one thermal destruction trigger is activated.

9. The self-destructing device of claim 1, wherein the top layer has a thickness of six microns.

10. The self-destructing device of claim 1, wherein a first amount of etchant material in the at least one chamber is approximately equal to a second amount of semiconducting material.

11. The self-destructing device of claim 1, wherein the at least one thermal destruction trigger is adjacent to a respective chamber of the at least one chamber.

12. The self-destructing device of claim 1, wherein the self-destructing device is a self-destructing electronic chip.

13. A self-destructing chip comprising:

a silicon substrate enclosing at least one chamber containing a combination of sodium bifluoride and xenon difluoride;

at least one active electronics layer provided over a first side of the silicon substrate, the at least one active electronics layer including at least one thermal destruction trigger, the at least one thermal destruction trigger coupled to a voltage source and configured to generate heat when powered;

silicon oxide provided between the silicon substrate and the at least one active electronic layers and between the silicon substrate and the at least one chamber enclosed by the silicon substrate; and a silicon nitride interface covering at least one opening of the at least one chamber on a second side of the silicon substrate;

wherein in response to activation of the at least one thermal destruction trigger, the self-destructing chip is configured to:

decompose the sodium bifluoride and release hydrogen fluoride at a first temperature to etch the silicon oxide between the silicon substrate and the at least one chamber;

expose xenon dilfluoride to the silicon substrate to destroy the silicon substrate and generate more heat resulting in an exothermic reaction;

etch the silicon oxide between the silicon substrate and the at least one active electronics layer; and facilitate the spread of the exothermic reaction to etch the at least one active electronics layer.

* * * * *